United States Patent [19]

Wilmsmeyer

[11] Patent Number: 4,530,108
[45] Date of Patent: Jul. 16, 1985

[54] COUNTER FOR NON-VOLATILE STORAGE
[75] Inventor: Klaus Wilmsmeyer, Denzlingen, Fed. Rep. of Germany
[73] Assignee: ITT Industries Inc., New York, N.Y.
[21] Appl. No.: 388,852
[22] Filed: Jun. 16, 1982
[30] Foreign Application Priority Data
  Jul. 16, 1981 [DE] Fed. Rep. of Germany ....... 3128127
[51] Int. Cl.³ .......................................... H03K 21/02
[52] U.S. Cl. .................................................. 377/111
[58] Field of Search ................. 377/110, 111, 130, 32, 377/107; 365/189, 218, 94
[56] References Cited
U.S. PATENT DOCUMENTS
3,614,751 10/1971 Narisawa ............................ 365/189
3,772,659 11/1973 Vries .................................... 365/94
4,347,587 8/1982 Rao ...................................... 365/189
4,366,557 12/1982 Wilmers ............................... 365/189

Primary Examiner—John S. Heyman
Assistant Examiner—K. Ohralik
Attorney, Agent, or Firm—Donald J. Lenkszus

[57] ABSTRACT

A counter for the non-volatile storage of an n-bit word includes a storage matrix having $2^m$ non-volatile electrically programmable storage elements which may be bitwise selected by means of a word shift register and a bit shift register, a binary counter having $m+n$ bistable flip-flops, with each one of the n Most Significant Bit flip-flops being coupled to a storage cell of a non-volatile storage device, and a clock sequence control for providing reset, erase and write pulses.

4 Claims, 2 Drawing Figures

COUNTER FOR NON-VOLATILE STORAGE

FIELD OF THE INVENTION

The present invention relates to a counter for the non-volatile storage of an n-bit digital word and, more particularly, to such a counter using electrically programmable semiconductor storage elements.

BACKGROUND OF THE INVENTION

With the aid of non-volatile, readable, electrically programmable semiconductor storage elements, such as MNOS transistors or floating-gate transistors, it is possible for information which is changed from time to time, to be electrically stored such that in the event of a supply voltage failure, the information is maintained. Examples of storage cells employing such electrically programmable semiconductor components are disclosed in the German Auslegungsschriften (DE-AS) Nos. 24 42 131, 24 42 132 and 24 42 134.

One of the most simple examples relating to a counter for non-volatile storage is a mechanical counter, as is used, for example, as an operating-hours meter (power-on time meter) or mileage indicator. Such a counter can be regarded as a storage device for an n-bit digital word.

When such a mechanical counter is designed in the form of a binary counter, as an electronic equivalent, the counter must have at least k cells in order to be able to count from 0 to $2^k - 1$. Additionally, each of the storage cells of this counter would have to contain at least one non-volatile, electrically programmable storage element if the counter reading is to be maintained during or following times when the operating voltage supply has been removed or turned off. The term programmable refers to writing a logical one or a logical zero into the storage element.

Non-volatile, readable semiconductor storage elements, such as MNOS field-effect transistors or alternately field-effect transistors with a gate electrode floating with respect to a potential, are known to have the property that the storage capability thereof decreases as the number of programming operations increases, with this being referred to as a degradation. As a result, only a limited number of programming cycles is possible. When such non-volatile storage elements are used in a counter, each incoming counting pulse requires that the storage elements have logical ones or zeros written therein in accordance with the code or counting sequence of the counter. Because the above noted non-volatile storage elements can be written into or erased only a limited number of times, a problem may be encountered if a binary counter having a larger number of stages or bits is to be implemented therewith. The problem is due to the fact that in the binary counting sequence, the least significant bits change much more often than do the most significant bits. Thus, the number of times a given non-volatile storage element an be written into imposes an upper limit on the size of the binary number that can be stored in a binary counter formed with such elements.

A simple binary counter employing electrically programmable semiconductor storage cells, with respect to the aforementioned degradation of the programmable storage elements, has the following two disadvantages:

(a) because of the binary code, the number of programming steps is higher than the number of counting steps. When a carry occurs, at least two stages have to change their contents; altogether, the number programming steps is approximately twice as high as that of the counting steps;

(b) the least significant bit (LSB) is most often programmed. At every counting step the least significant bit must change state. This alone determines the maximum number to be stored.

SUMMARY OF THE INVENTION

It is the object of the invention to provide an electronic counter having non-volatile storage, employing electrically programmable semiconductor storage elements of the type mentioned hereinbefore, which counter is capable of having a large counter reading without causing any loss of storage time.

In accordance with the invention, a matrix storage unit is used for the less significant bits. The storage cells thereof comprise non-volatile, electrically programmable storage elements of the type mentioned hereinbefore. The matrix storage locations are programmed successively, so that all of the storage cells are written into the same number of times, unlike in the case of a binary counter, in response to counting pulses. A binary counter, likewise comprising non-volatile electrically programmable storage elements, will be used to retain how often the total matrix has been programmed or loaded with all ones. The number of counting steps is increased in that (a) during almost all counting steps only one single storage cell has been programmed, and (b) that almost all storage cells are subjected to the same number of write-erase cycles.

Theoretically, if z is the number of write-erase cycles to which a storage transistor can be subjected, and N is the number of storage transistors in a counter according to the invention, it is possible to count up to $2 \cdot z \cdot N$ in cases where $2^N - 1 > 2z \cdot N$, which is certainly the case with a sufficiently great N. Relative thereto, where only one part of the cycle, such as only the writing, can be carried out individually for each storage transistor, the maximum number of counts is smaller. It is attempted by the invention to come as close as possible to this maximum number.

In accordance with the invention, a non-volatile counter is provided that includes non-volatile means for storing including a plurality of binary storage locations with each location being programmable to store a one or a zero, means for addressing each location, means for counting the number of times that all of the storage locations have been set to all ones, and control means for changing the contents of only one selected, addressed storage location in response to a counting pulse including means for resetting all of the storage locations to a logical zero in response to a counting pulse, provided that all storage locations had previously been set to a logical one.

DETAILED DESCRIPTION OF THE PREFERRED EMBODIMENTS

Figure 1:
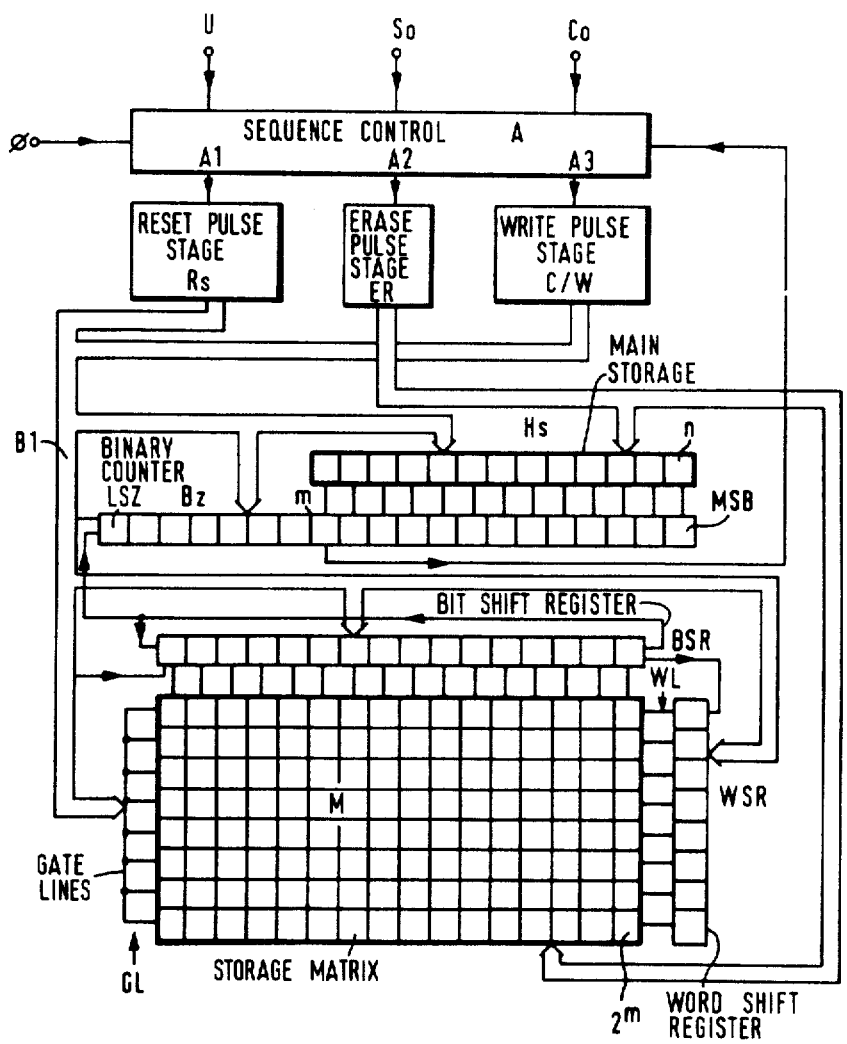
FIG. 1 shows a block diagram if the counter according to the invention.
Figure 2:
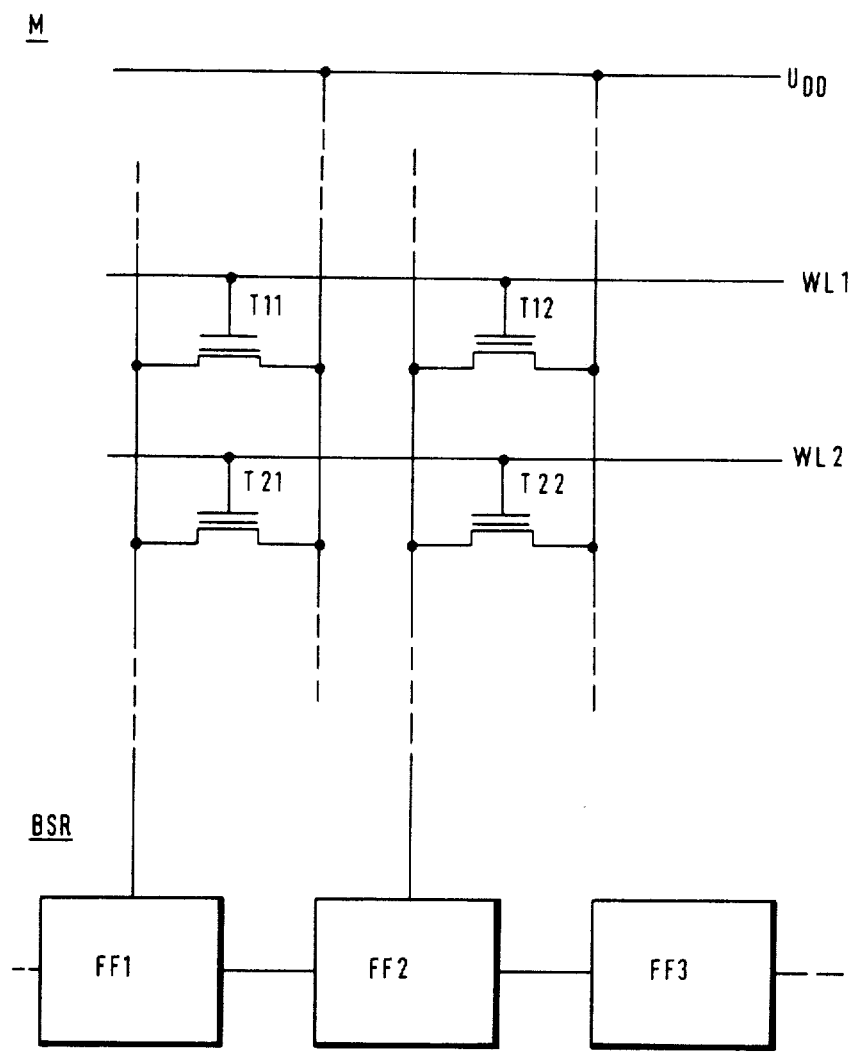
FIG. 2 shows part of a storage matrix comprising dynamic storage cells which each contain one non-volatile programmable storage element in the form of a MNOS field-effect transistor and are each connected to one bit shift register cell of the counter according to the invention.

In order to bring the number of the maximum possible counting steps to a high as possible value, the counter according to the invention is divided into two parts. The main part is formed by the matrix M as shown in FIG. 2, consisting of $2^m$ non-volatile electrically programmable storage elements which each contain at least one storage transistor of the type mentioned hereinbefore with respect to FIG. 1. The $2^m$ storage elements of the storage matrix M are selected bitwisely via a word shift register WSR and a bit shift register BSR. The $2^m$ storage elements of the storage matrix M are successively programmed at each counting step in response to counting pulses.

In synchronism with the counting process in the storage matrix M there is performed a counting process in the binary counter Bz. Binary counter Bz is formed of volatile storage circuit elements. Consequently, the counter Bz is not subject to the aforementioned degradation. The binary counter Bz contains $m+n$ bistable storage cells. The most significant n storage cells are each coupled to one non-volatile storage cell of a main store Hs. The main store Hs, just like the storage matrix M, contains non-volatile programmable storage elements. Main store Hs, which can be regarded as a storage register, counts the number of times that the matrix M has been set to all ones.

As soon as the $2^m$ storage element of the storage matrix M has been set to a logic one, the $m+1$th bit of the binary counter Bz will receive the logic one in response to the next counting pulse. This counting pulse, as is shown in FIG. 1, is applied to a $\emptyset$-clocked sequence control A and produces at the second output A2 an erase signal, so that in the erase pulse stage Er as connected to the second output A2, there is produced an erase pulse, thus causing the entire storage matrix M to be reset to all zeros.

The sequence control A is designed such that when applying a start signal So, at the beginning of counting, to the sequence control A, a first erase signal will appear at the second output A2. This erase signal not only erases the storage cells of the main storage Hs, but also those of the storage matrix M. Then, after each time $2^m$ counting pulses, a second erase signal will appear at the second output A2 which merely erases the storage cells of the storage matrix M.

Apart from the clock signal $\emptyset$ and the counting start signal So, the supply voltage U and at Co, the counting pulses are applied to the sequence control A.

The sequence control is designed so that, at the beginning of counting, or following a failure of the supply voltage, a resetting signal will appear at the first output A1. This signal via the reset-pulseout-stage Rs, produces the resetting pulses which serve to reset the binary counter Bz, the bit shift register BSR and the word shift register WSR. Subsequently thereto, there are produced in the reset-pulseout-stage Rs reading pulses of a reading cycle with the aid of which the information contained in the main storage Hs and in the storage matrix M are written into the binary counter Bz.

At the beginning of the counting operation, all of the storage transistors in the storage matrix M as well as those in the main storage Hs, and in the course of an erase cycle, are set, for example, to lower threshold voltage ($U_{DD}$)-values, which are to represent logic zeros. After this, there is performed a reset and read cycle as is also performed in the case of any voltage failure, after reinsertion or switching on of the supply voltage. The binary counter Bz thus contains the binary sequence 000 . . . 0, while the bit shift register BSR as well as the word shift register WSR have been brought to 100 . . . 0.

In the course of a first reading operation, the contents of the main storage Hs is then written into the bit positions $m+1$ to n of the binary counter Bz. Moreover, the content of the first word of the storage matrix M is transferred into the bit shift register BSR. With the aid of the clock, the entire information contained in the bit shift register BSR is once logically shifted and, in the course of this, recorded by the binary counter Bz. This information consists of a word occupied either completely or only partly with ones. Subsequently to the logical shift of a word completely occupied with ones, the respective next word of the storage matrix M is read, logically shifted, and written into the binary counter Bz. Following a word with at least one zero, there is no longer a transfer to the next word. With the reading in the binary counter Bz in accord with the reading in the storage matrix M, the counter changes over to normal counting operation.

Moreover, the sequence control A is designed such that, in response to each counting pulse, a write signal will appear at the third output A3, at which the gate lines GL of the storage matrix M and the input of the binary counter Bz, via the bus B1, are supplied with a write pulse following each counting pulse.

Accordingly, each counting pulse is recorded in the binary counter Bz as well as in the storage matrix M. In the storage matrix M, a subsequent storage cell corresponding to the position as selected by the word shift register WSR and the bit shift register BSR, assumes the state of the preceding storage cell. The new status of the bit shift register BSR is written into the word as characterized in the word shift register WSR by one single One. When the bit shift register BSR is full, the One is shifted by one position further in the word shift register WSR, and the bit shift register BSR is scaled (100 . . . 0). After all storage elements of the storage matrix M have been written, the main storage Hs as well as the storage matrix M are erased and the information contained in the binary counter Bz is written into the main storage Hs. Thereafter, the bit shift register BSR as well as the word shift register WSR are scaled, i.e., brought to (100 . . . 0).

In the example explained hereinbefore, it was assumed that the non-volatile storage is effected in storage cells which are written bitwisely and which are capable of being erased in a word-oriented manner. Since it is certainly easily possible to integrate 1,000 or 2,000 storage transistors into the storage matrix M, the maximum storable number compared with that of the binary counter of the aforementioned kind employing storage transistors in every stage, is increased by the factor $10^3$.

Quite depending on whether the non-volatile electrically programmable storage elements are designed to have one or two transistor cells and for a bitwise or rowwise erase, the overall circuit and the program sequence of the binary counter Bz will have to be slightly changed.

In the most simple case, the storage elements of the storage matrix M each consist of a storage transistor, for example, of a MNOS field-effect transistor. FIG. 2 shows that part of the circuit of such a storage matrix comprising four storage cells each containing one MNOS field-effect transistor T11, T12, T21, T22. The gate electrodes of the MNOS field-effect transistors T11, T12, T21, T22 are row-wisely connected to word lines WL1, WL2. The source electrodes of each time one column are connected to the set input of a flip-flop cell FF1, FF2, FF3 of the bit shift register BSR while the drain electrodes are connected to the supply voltage $U_{DD}$.

What is claimed is:

1. A non-volatile counter for counting pulses comprising:
   non-volatile means for storing including a plurality of binary storage locations with each said location being electricaly programmable to store a binary one or a zero a selected number of times;
   means for addressing each said location;
   means for counting the number of times that all of said storage locations have been programmed to a binary one; and
   control means for changing the contents of only one selected addressed storage location in response to each counting pulse including means for programming all of said storage locations to a binary zero in response to a counting pulse provided all of said locations had been programmed to a binary one and for incrementing said counting means by one count.

2. A counter as defined in claim 1 wherein:
   said counting means includes a store formed of non-volatile storage elements.

3. A counter as defined in claim 2 wherein said control means and said addressing means successively address one of said storage locations after the other and said control means programs each said addressed storage location to a binary one in response to said counting pulse.

4. A counter as defined in claim 2 wherein:
   said counting means includes a binary counter formed of volatile storage elements.

* * * * *